US005665989A

United States Patent [19]

Dangelo

[11] Patent Number: 5,665,989
[45] Date of Patent: Sep. 9, 1997

[54] PROGRAMMABLE MICROSYSTEMS IN SILICON

[75] Inventor: Carlos Dangelo, Los Gatos, Calif.

[73] Assignee: LSI Logic, Milpitas, Calif.

[21] Appl. No.: 367,556

[22] Filed: Jan. 3, 1995

[51] Int. Cl.$^6$ .............................. H01L 27/06; H01L 21/70
[52] U.S. Cl. .................. 257/210; 257/209; 257/211; 438/106; 438/129
[58] Field of Search ................ 29/846, 847; 174/250, 174/253, 255, 260, 261; 257/700, 723, 724, 786, 529, 530, 665, 209, 210, 211; 361/748, 760, 772, 773, 774, 777, 779, 780, 781, 782, 783, 792–795; 437/208, 209, 51; 428/148, 901; 439/68, 69

[56] References Cited

U.S. PATENT DOCUMENTS

| | | | |
|---|---|---|---|
| 3,726,002 | 4/1973 | Greenstein et al. | 174/264 |
| 3,871,015 | 3/1975 | Lin et al. | 357/67 |
| 3,980,917 | 9/1976 | Kakizaki et al. | |
| 4,067,104 | 1/1978 | Tracy | 29/626 |
| 4,418,857 | 12/1983 | Ainslie et al. | 228/180 |
| 4,545,610 | 10/1985 | Lakritz et al. | |
| 4,547,834 | 10/1985 | Dumont et al. | 361/386 |
| 4,606,962 | 8/1986 | Reylek et al. | 428/148 |
| 4,646,050 | 2/1987 | Kling et al. | |
| 4,664,309 | 5/1987 | Allen et al. | 228/180.2 |
| 4,705,205 | 11/1987 | Allen et al. | 228/180.2 |
| 4,783,722 | 11/1988 | Osaki et al. | 361/411 |
| 4,835,344 | 5/1989 | Iyogi et al. | |
| 4,954,878 | 9/1990 | Fox et al. | 357/81 |
| 5,014,111 | 5/1991 | Tsuda et al. | 357/68 |
| 5,046,954 | 9/1991 | Schmedding | |
| 5,054,192 | 10/1991 | Cray et al. | 29/835 |
| 5,074,947 | 12/1991 | Estes et al. | 156/307.3 |
| 5,360,767 | 11/1994 | Narayanan et al. | 437/208 |

FOREIGN PATENT DOCUMENTS

| | | |
|---|---|---|
| 0327399A1 | 8/1989 | European Pat. Off. |
| 0329314A1 | 8/1989 | European Pat. Off. |

OTHER PUBLICATIONS

LSI Logic Lexis Search, Aug. 2, 1994, pp. 2–98.
IBM Technical Disclosure Bulletin "Silicon, Elevated, Wireless Module Method For Making Engineering Changes" vol. 31 No. 10 (pp. 71–74) Mar. 1989.

*Primary Examiner*—Donald Sparks
*Attorney, Agent, or Firm*—Townsend and Townsend and Crew LLP

[57] ABSTRACT

An integrated circuit fabrication method and apparatus to improve the design cycle time for implementing an electrical system in silicon. The invention uses predefined core, or cell, patterns to provide some of the functionality for a system design. The cores are interconnected using thick wire conductors and solder bumps so that conductive paths that do not lie within the plane of the substrate of the silicon chip containing the cores are provided. Since the conductive paths do not lie on the process surface of the chip, the topographical design of the chip is not affected by the interconnections. Further, the thick wire conductors result in essentially zero propagation delay so that timing design errors are greatly reduced, or eliminated, in the design cycle. The invention allows for a rapid prototype of the entire design to be produced early in the design cycle. In one embodiment, customer logic is arranged around the periphery of the substrate while the core cells are in the middle of the substrate.

19 Claims, 6 Drawing Sheets

PROGRAMMABLE MICROSYSTEMS IN SILICON

BACKGROUND OF THE INVENTION

This invention relates generally to fabrication of a microelectronic circuits on a silicon substrate to produce an integrated circuit and specifically to a system for efficient design of an integrated circuit by interconnection of predefined microcircuit cores.

The size and complexity of microelectronic circuits fabricated on silicon substrates to make an integrated circuit (IC) are constantly growing. Today's ICs, especially the complex "system on a chip" circuits, include hundreds of thousands of gates and a corresponding larger number of interconnections among the gates. The costs of producing such large scale integrated circuits depends on the resources required for each step in the design phase.

The first step in the design phase is the conceptualization step where a human designer decides broad functionality of the IC chip should have. After the functionality has been determined the designer will produce a high-level circuit description such as a block diagram. Next a more detailed circuit description such as a schematic diagram will be created that specifies the design to the gate level, at least for some of the functionality.

Typically, these circuit descriptions break the design up into functional blocks and show interconnections between the functional blocks. Once the design has been sufficiently described by the circuit descriptions the designer, or design team, will go ahead and prototype the design, if the design is small enough, or may simulate the design on a computer system if the design is large and complex. For large systems a combination of prototyping and simulating is usually employed.

At some point in the design process the designer team decides on an implementation technology for the circuit. This technology can include discrete circuit design, programmed logic array, gate array, custom or semi-custom design, etc. When the circuit is very large a common implementation is to use a the semi-custom approach where the circuit is built up of existing "cells" or "cores" from an existing library of predefined cores. Using the core approach, functional blocks in the circuit description are easily implemented in the design with the existing micro circuits in a predefined core that performs the desired function. Two or more predefined cores are interconnected by metal conductors fabricated on the substrate in any of a variety of process methods as is commonly known in the art. Since all of the functionality of the new design will typically not be achieved with existing cores, additional microcircuitry to perform the missing functionality is designed and fabricated on the chip. This additional microcircuitry is referred to as "custom" or "customer" logic.

An example of a semi-custom implementation is a microprocessor based application that uses cores common to computer systems such as a central processing unit (CPU), memory, input/output (I/O) unit, and customer logic. It will be readily apparent that designs for common cores such as a processor, memory, I/O unit, etc. can be used over and over again in many different chip designs. In each of these different chip designs, while the cores may be the same, the customer logic and interconnections between the cores will vary.

Using standard, or common, cores accelerates the design process for an integrated circuit because the cores, which may consist of many tens of thousands of gates, are predefined and reusable in a variety of designs. However, traditional approaches to using common cores suffer from problems in interconnecting the cores where the system design is complex and uses several cores and custom circuitry. Because the surface area, or process area, on the silicon substrate is limited, the large number of interconnections between cores makes it difficult to adequately route the interconnecting signals. Further, timing design errors are prevalent as clock speeds increase, conductor paths lengthen and fan out and the number of distribution points for a signal increases.

A source of timing design errors occurs where signal skew causes an unanticipated logic condition that must be taken care of by redesigning, rerouting, or making another modification to the design. A major source of timing design errors is in the routing of signals between core cells in the semi-custom IC design. At current system clock rates, even the distribution of a clock signal to different cores may cause problems since the clock will experience different delays depending on the length of the routing path. Current design methods attempt to alleviate some of the burden to human designers in detecting and preventing timing design errors by using computers to simulate the performance of a circuit before the circuit is formed in silicon. However, 30–40% of the design cycle is still spent on timing redesign to correct timing design errors.

Part of the reason timing design errors are so prevalent in today's ICs design cycles is that as IC become denser and clock speeds become greater, the widths of the conductors on ICs are becoming more numerous, closer spaced, greater in length and smaller in width. This causes increased timing errors due to propagation delays and inductive and capacitive effects. Methods to provide larger conductive paths within an IC, such as a "solder bump" metallization and "flip chip" packaging and assembly (also referred to as the "controlled collapse chip connection," or "C4"), only address the problem of providing paths from pads on the substrate to external pins on the IC package.

Timing design errors are magnified in today's approach to using common cores in semi-custom designs because the implementation into silicon is "iterative". That is, the design is implemented in silicon in several steps so that the design team doesn't obtain a complete system in silicon until near the end of the design cycle. This means that different timing design errors manifest at different times in the design cycle. It also means that some timing design errors that are present in the middle of the design cycle are unrelated to the actual design and are not accurate representations of timing design errors that would or would not occur when the entire design is in silicon.

Accordingly, it is desired to improve the design cycle time to implement a design for an electronic system in silicon.

SUMMARY OF THE INVENTION

The present invention improves the overall design process in fabricating large and complex high-density electronic systems on silicon substrates, or chips. The invention uses predesigned cores. The cores are interconnected using thick conductors or so-called "wide wires" that have a larger cross section than standard microelectronic conductors and which do not lie in the plane of the substrate. This has the advantage of removing interconnection routing considerations from other aspects of the topological design of the chip. The present invention uses thick, or/wide, wires for interconnection of cores. The thick wires eliminate timing design errors and timing considerations because they provide near zero delay propagation paths for electrical signals between the cores. The simple interconnection method proposed by the present invention allows the entire design to be placed in silicon at a very early stage of the design cycle.

The interconnections of cores may be advantageously automated by using a computer, thus providing a flexible "programmable" approach to semi-custom IC design using predefined cores. The time-consuming procedure of iteratively placing different portions of the design in silicon is eliminated.

One embodiment of the invention includes an integrated circuit formed on a silicon substrate. First and second cores are formed on the surface of the substrate and each of the cores contains one or more conductor contacts. Conductive paths are formed to join the conductor contacts between the cores by using conductors that lie outside of the plane of the substrate.

DESCRIPTION OF THE PREFERRED EMBODIMENT

Figure 1:
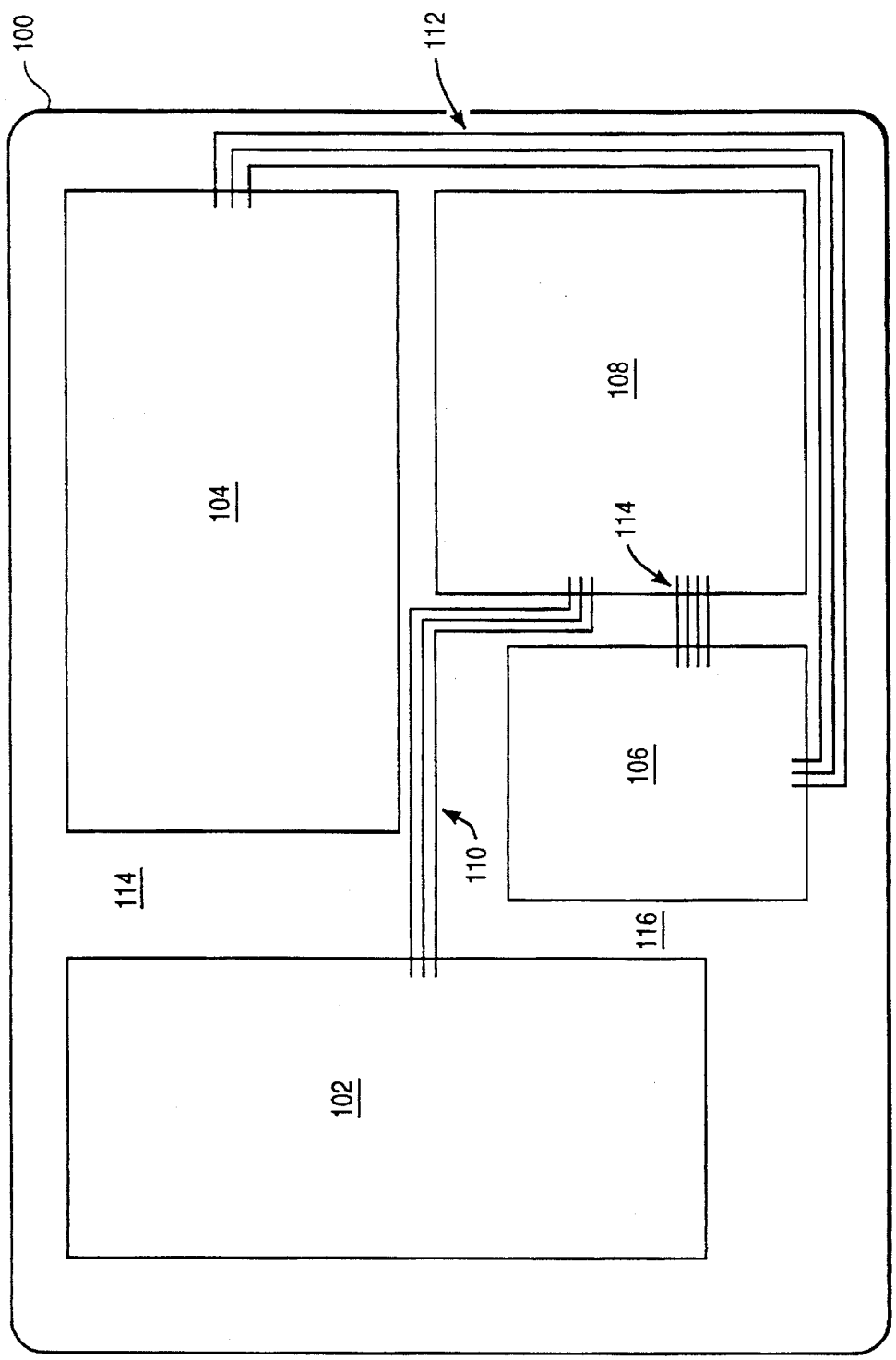
FIG. 1 is an example of an arrangement of interconnected cores on a silicon substrate according to the prior art.

FIG. 1 is an example of an arrangement of cores on a silicon substrate according to the prior art. FIG. 1 is a top view looking down at the process side of a silicon substrate. In FIG. 1, substrate 100 includes cores 102, 104, 106 and 108. Each core is shown as a rectangular block but is, in actuality, a definition, such as a lithographic mask pattern, that defines gates and other semiconductor devices in a manner suitable for fabrication on silicon substrate 100. For example, core 102 may be a CPU, core 104 may be built-in self-test (BIST) logic, core 106 may be I/O circuitry and core 108 may be random access memory (RAM). Note that the cores are arranged so that there is space between the cores, such as spaces 114 and 116, so that interconnections between the cores may be fabricated on substrate 100 within the spaces.

Interconnections 110, 112 and 114 are shown as groups of three or four conductor buses. In actuality, there will be many such buses of varying numbers of conductors. There will also be additional wire routing between the cores and additional custom circuitry, "glue" logic, etc., not shown in FIG. 1 for ease of illustration. In practice, the number of conductors needed, and the topology of their point-to-point connections, make it very difficult to fabricate all of the necessary conductor routings on the substrate. Because of the density of conductor routings, the conductors must be made as thin as possible. However, the reduced thickness of the conductors results in increased propagation delays from parasitic capacitance and inductance, and from increased susceptibility to noise. Sometimes multiple routing levels are fabricated onto the substrate's surface to provide independent routing surfaces. However, the thickness of the conductors is still limited by the process constraints of forming metal conductors on silicon.

Figure 2:
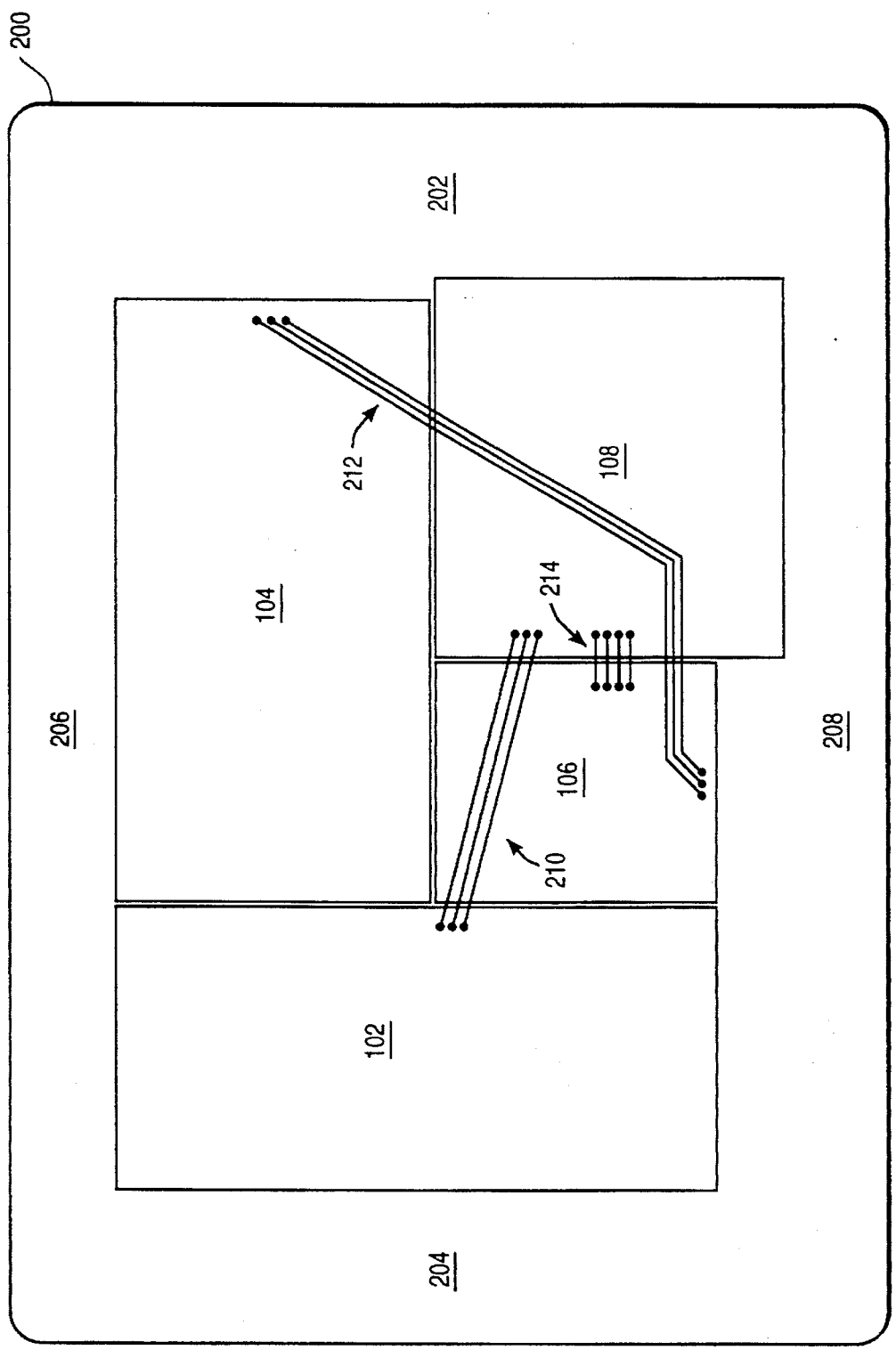
FIG. 2 is an example of an arrangement of the same cores of FIG. 1, arranged and interconnected according to the present invention.

FIG. 2 illustrates an arrangement and interconnection of the same cores of FIG. 1 according to the present invention. In FIG. 2, substrate 200 includes cores 102, 104, 106 and 108 as in FIG. 1. In general, identical numbering of items in different figures is used to denote the same item. As shown in FIG. 2, the cores are formed on substrate 200 without the relatively large spacing between cores that was used in FIG. 1. In other words, spaces such as 114 and 116 of FIG. 1 are not present in FIG. 2 because the cores are arranged substantially adjacent to one another. Because the cores in FIG. 2 are adjacent to one another, there is more space on substrate 200 at the right, left, top and bottom sides, indicated as 202, 204, 206 and 208, respectively, for custom logic (not shown) that is specified by a designer and which implements functionality specific to the designer's application.

In FIG. 2, the interconnections, or conductors, 110, 112 and 114 of FIG. 1, are replaced by wire conductors 210, 212 and 214, respectively, which are routed in a plane that other than that of substrate 200. The non-planar routing of the wire conductors is more clearly shown in FIGS. 3A–C, discussed below. Because of the non-planar routing, the wire conductors may "cross" the core areas without interfering with the function of the cores. This means that the wire conductors may be made shorter in length to reduce propagation delays. Moreover, as explained below, the non-planar routing allows larger "thick wires" to be used so that the propagation delay of signals on the wires is negligible as compared to the metal conductors fabricated onto the substrate employed in the prior art shown in FIG. 1. As used in this specification, "thick wires" include any conductor with a cross section significantly larger than the cross section of a standard microelectronic conductor fabricated on the substrate of a semiconductor chip. Thick wire conductors have less loss and negligible propagation delays over standard conductors.

Figure 3A:
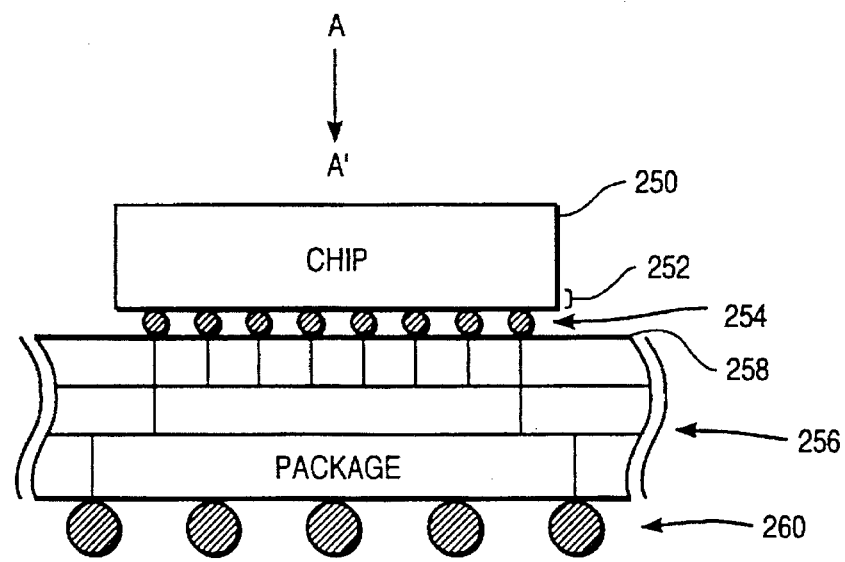
FIG. 3A is a side view of a preferred embodiment of the present invention using a "flip-chip" approach to implement the non-planar thick wire conductors.

FIG. 3A is a side view of a preferred embodiment of the present invention using a "flip-chip" approach to implement the non-planar thick wire conductors. In FIG. 3A, silicon chip 250 includes a process surface 252 that is facing downwards after the chip has been "flipped" over. Solder bumps at 254 are shown as dark circles in FIG. 3A. Package 256 includes a thin film surface 258 that is in contact with solder bumps 254. To complete the package, the solder bumps are "reflowed" so that they make a permanent electrical contact with pads on thin film surface 258. Thin film surface 258 includes the thick wire conductors at specific positions so that the thick wire conductors are in contact with the desired solder bumps when substrate 250 is placed in contact with thin film surface 258. Pins 260 at the bottom of the package are coupled to selected bumps so that connections may be made to external circuits, as is known in the art.

Figure 3B:
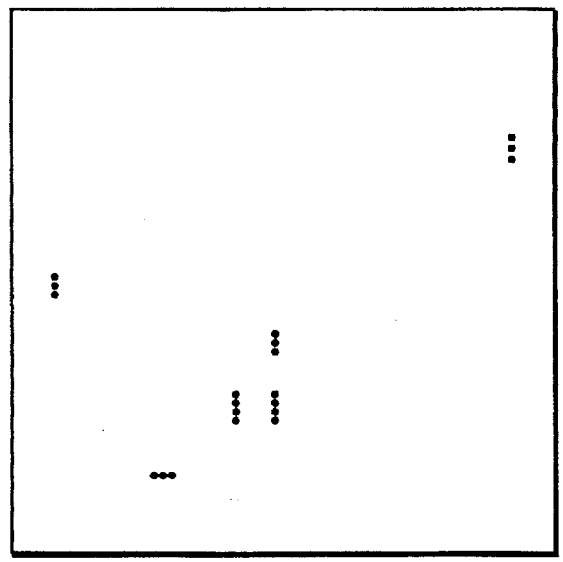
FIG. 3B shows solder bumps on the surface of the chip of FIG. 3A.

For example, FIG. 3B shows solder bumps, represented by dark dots, on the surface of the chip of FIG. 3A. The chip's process surface 252 is being viewed along the line A–A'. Note that the layout of bumps would actually be the mirror image of that shown in FIG. 3B since the chip has been flipped over and the view is from the back of the chip, through the chip, to the process surface. However, for ease of discussion, we assume that, instead, the layout of bumps is the same as the view of the substrate surface presented in FIG. 2.

Figure 3C:
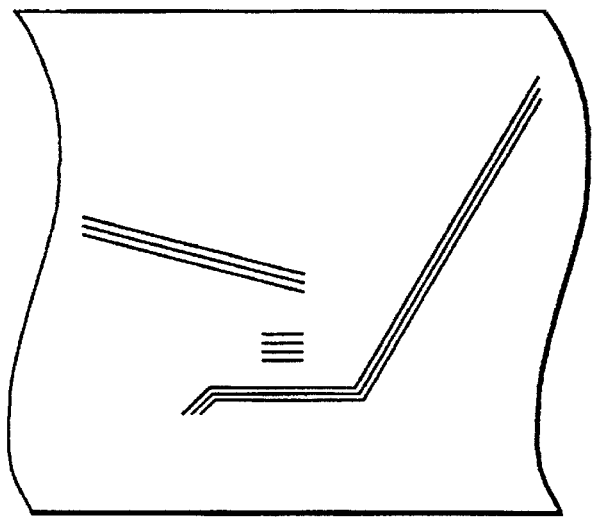
FIG. 3C shows conductors on a thin film surface of the chip of FIG. 3A.

FIG. 3C shows thin film surface 258, also along the viewing line from A to A'. Conductors on the surface are shown as lines. Note that the bumps of FIG. 3B will match up with the ends of the conductors of FIG. 3C when the chip represented by FIG. 3B, is placed on top of the thin film surface represented by FIG. 3C.

In a preferred embodiment, I/O pads or "ports" are designed into each core to facilitate a conductive connection to bumps formed on top of the process surface into which the core has been fabricated. The ports are made of metal pads that provide sufficient surface area to form a good conducting contact with the solder bump. Also, the pads are placed far enough apart to insure that unwanted connections between the pads will not be formed when the bumps are reflowed. Naturally, many more pads, bumps and thick wire conductors than are shown in FIGS. 3A–C may be present in integrated circuit designs using the techniques of the present invention.

Figure 4:
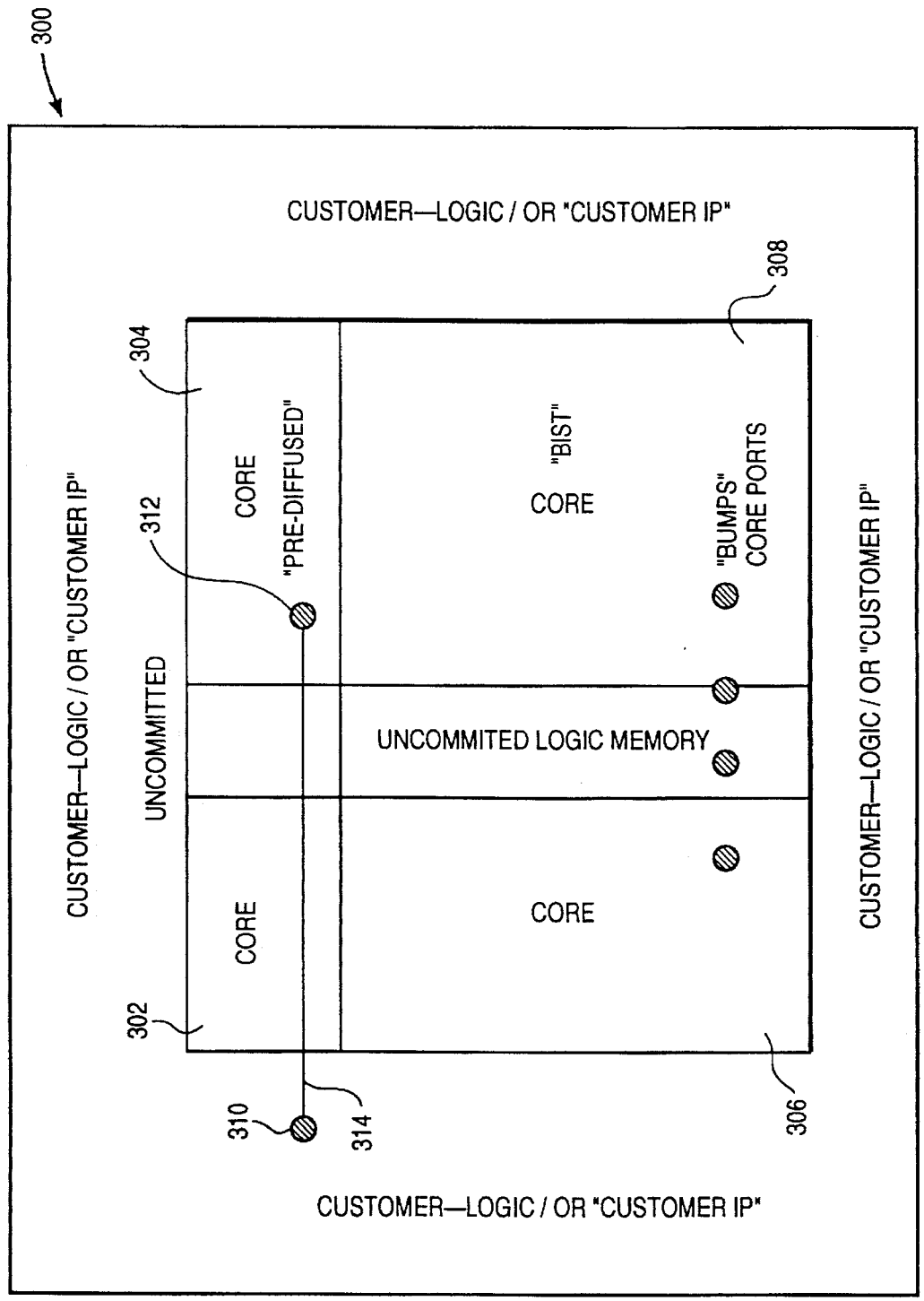
FIG. 4 is an illustration of a second configuration of cores according to the present invention.

FIG. 4 is an illustration of another configuration of cores according to the present invention showing a topological layout of a preferred embodiment where customer logic is fabricated at the periphery of the chip while the cores are formed in the center of the chip.

In FIG. 4, substrate 300 is shown with its process side up, as in FIGS. 1 and 2. Cores such as 302, 304, 306 and 308 are formed on substrate where the cores 302 and 306 are adjacent and cores 304 and 308 are adjacent. Additional area between cores 302 and 304 and between cores 306 and 308 is available for forming other cores or for routing conductors, forming customer logic, etc., as is known in the art. In other words, the core, port and non-planar interconnection aspect of the present invention may be used in conjunction with traditional methods of integrated circuit fabrication.

FIG. 4 shows areas of "customer logic" around the periphery of substrate 300. Customer logic is logic that must be designed and fabricated according to the specific system design as determined by the end application of the chip. The customer logic may be implemented with cell-based, gate array, field programmable gate array (FPGA) or other approaches. Typically, a set of predefined cores is used to create a baseline functionality for the chip. Customer logic is then formed around the set of cores and is interconnected with the cores via thick wire and solder bumps to predefined ports on the cores.

The cores are also interconnected according to the requirements of the customer's system design. For example, FIG. 4 shows metal (i.e., solder) bumps 310 and 312 interconnected by thick wire 314 according to the present invention as discussed above. This provides a connection between a port pad at bump 312 in core 304 and customer logic at bump 310. The preferred embodiment uses appropriate buffered ports that provide the current needed to adequately, drive the zero delay thick wires.

A typical layout could be where core 304 is a memory block. In this case, thick wire connections as illustrated in FIG. 4 by thick wire 314, are desirable since the memory block is a critical path of timing design. Naturally there would be multiple wires from the memory block to customer logic and other parts of the chip. Usually, the wires would form a data bus made of 8, 16, etc., thick wires.

By placing the customer logic around the periphery of pre-designed and pre-fabricated cores the customer may easily specify later generations or revisions to the basic design without affecting a large portion of the chip topographical layout, core selection, interconnections and other aspects of the design. This means that a large amount of redesign can be performed without affecting the majority of the chip's pre-existing and tested design. Since the customer logic is usually the logic that will change from revision to revision, the layout of FIG. 4 is especially suited for fast and efficient modification of existing designs.

Figure 5:
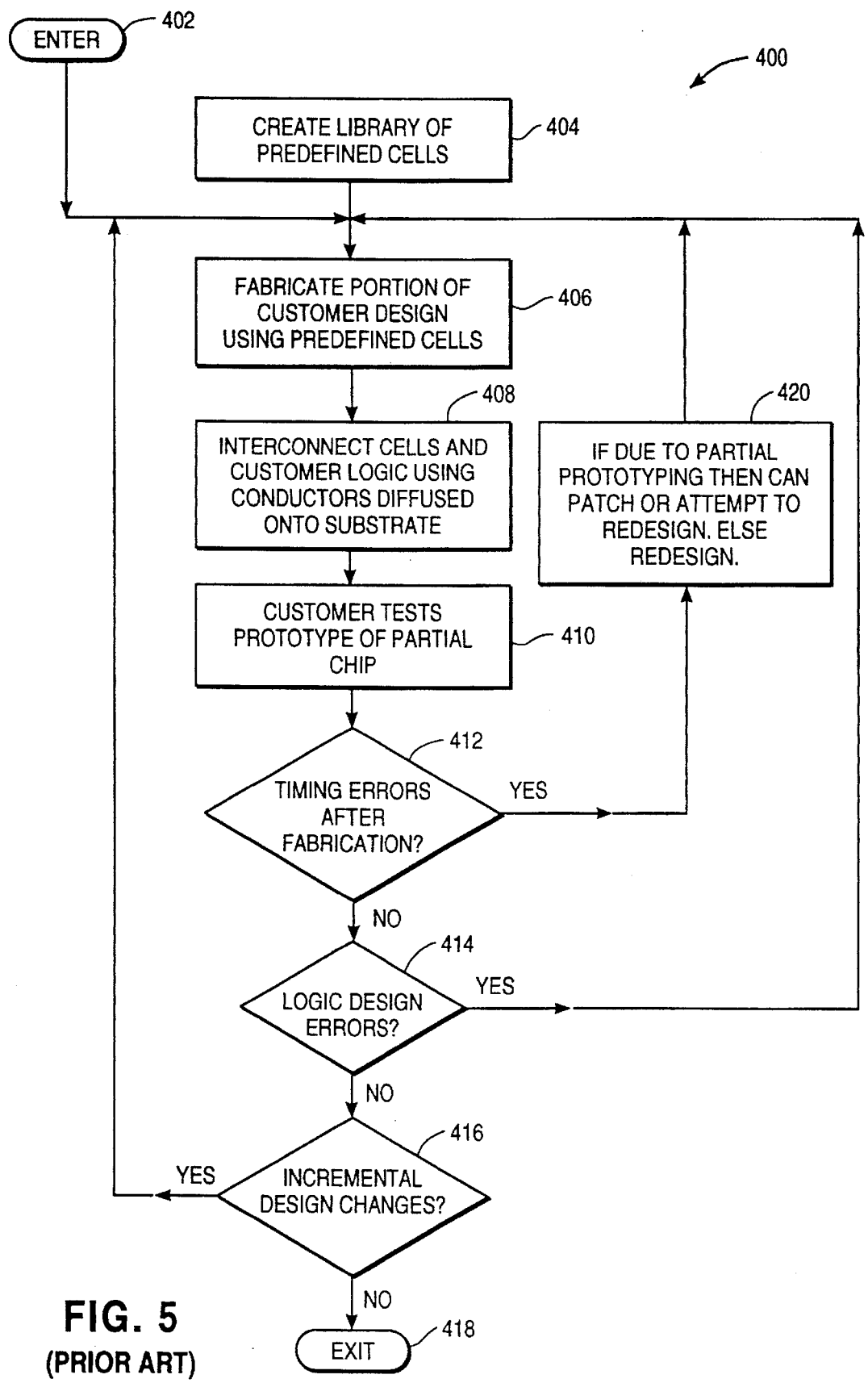
FIG. 5 is a flowchart of basic steps in a prior art approach to designing a semi-custom integrated circuit.
Figure 6:
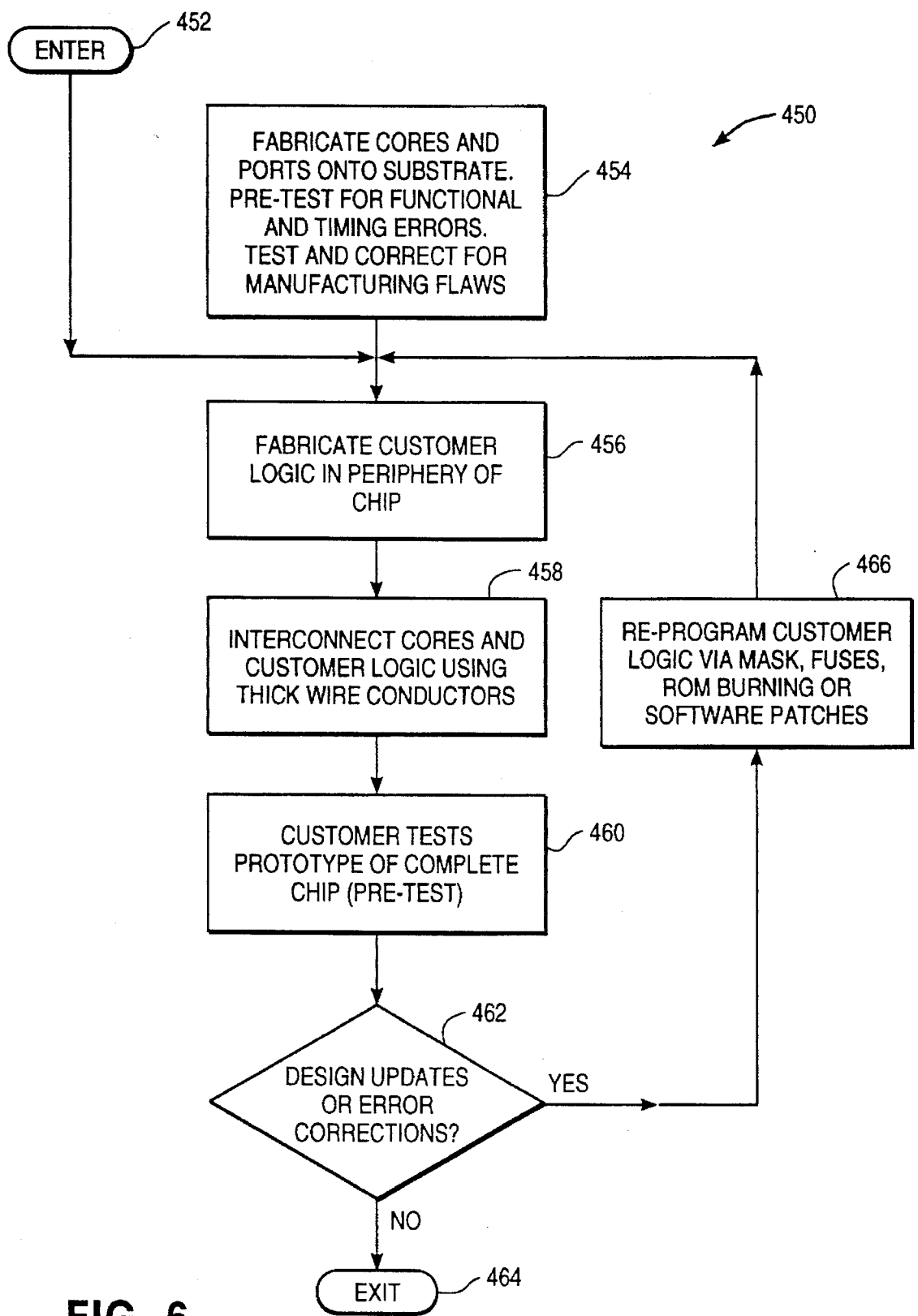
FIG. 6 illustrates the basic steps in an integrated circuit design methodology according to the present invention.

Next FIGS. 5 and 6 will be discussed to describe a prior art method and the method of the present invention. FIGS. 5 and 6 show broad illustrative steps in a design cycle to create an integrated circuit. Such a design cycle may take several months or years to complete.

FIG. 5 is a flowchart of basic steps in a prior art approach to designing a semi-custom integrated circuit. In FIG. 5, the flowchart 400 is entered at step 402 where it is assumed that step 404 has already been performed. Step 404 specifies that a library of predefined cells has been prepared. Such cell libraries include blocks of components that implement a basic function of the desired integrated circuit.

Step 406 is next performed to fabricate a portion of the customer design using the predefined cells from the library. The cells are positioned with the aid of a computer program that handles the complex task of topological "floor planning" of the cells and interconnections on the substrate's surface. Typically only a portion of the customer's circuit is fabricated at this point because of the need to produce a fast prototype of a portion of the circuit for testing and because the customer design may be subject to change. Step 406 of forming cells on the substrate will also typically include forming customer logic at any available and convenient areas on the substrate. Once a portion of the circuit has been fabricated, step 408 is performed to interconnect the cells. The interconnections are made by, e.g., metal vapor deposition on one or more layers on the surface of the substrate.

Step 410 is performed after the cells are interconnected and a prototype of the partial circuit is delivered to the customer. The customer then tests the partial circuit by, in some cases, connecting the prototype chip to, external circuits, simulators, emulators, etc., which can provide the functionality that is missing from the partial prototype. At step 412 a determination is made as to whether there are timing design errors. If so, step 420 is executed to determine whether the timing design errors are due to the partial prototype and necessity of interfacing with external devices to provide functionality (i.e., "artificial" errors), or whether the timing design errors are actually the result of design problems in the chip layout and signal routing (i.e., "real" errors). This is a time consuming step that requires analysis by human designers.

If the timing design error is not a real error, that is, if the error is the result of interfacing to external equipment, then a decision is made as to whether to try to correct the error by changing the chip design, external interface, or method of testing the prototype. If the timing design error is real, or if the artificial error is deemed correctable by changing the chip design, steps 406–410 are again executed to produce a prototype without the timing design error.

If, at step 412, it is determined that there are no timing design errors then step 414 is performed. Step 414 determines whether there are any logic design errors in the prototype. If so, a designer corrects the errors in the design and steps 406–410 are again performed to correct the logic design errors. Note that steps 406–414 represent loops in an iterative design process. The necessity for incrementally correcting the design is a result of the partial implementation in silicon which, in turn, is dictated by the complexity of forming a complex circuit in silicon by today's methods. The incremental testing/design approach and artificial errors introduced by relying on external devices to perform some of the chip's functions during the testing phase compound each other, especially in large designs. As mentioned above, 30–40% of the time to design and fabricate a chip may be spent on timing redesign.

Assuming, at step 414, that there are no logic design errors, step 416 is next performed. At step 416, if the customer desires design changes then steps 406–414 are repeated, as necessary, to modify the design. The method of flowchart 400 is exited at step 418 when no more design changes are required.

FIG. 6 illustrates the basic steps in a design methodology according to the present invention. The steps in flowchart 450 may be carried out with the aid of a computer or other machine. The steps are illustrative of generalized actions involved in the design of an integrated circuit according to the present invention. Steps may be added, or removed from, flowchart 450 without departing from the scope of the present invention. The selection of discrete steps is somewhat arbitrary since each discrete step is representative of, and may be broken up into, multiple substeps. Also, steps shown in FIG. 450 may be combined without departing from the scope of the invention.

In FIG. 6, flowchart 450 is entered at step 452 so that step 456 is next performed. Prior to performing step 456, step 454 is performed so that cores and ports are formed onto a substrate and tested for functional (i.e., logic) and timing design errors. The cores and ports are also pre-tested for manufacturing flaws at step 454. The forming of the cores and ports onto the substrate is dictated according to the basic functional requirements of a customer's logic design. The method of the present invention can be applied with special advantage to vertical markets such as digital video, network controllers, video compression/decompression (codec) systems, or other microprocessor-based systems where there are well-defined groupings of core functional blocks. This is because the basic functionality of such systems is common throughout the different applications. That is, a digital video, codec or other microprocessor application will have the same basic cores of processor, memory, I/O, etc., and may thus share the same cores and interconnection circuitry.

At step 456 the entire customer logic is fabricated in the periphery of the chip similar to the illustration of FIG. 4. A definition of the customer logic may be specified by lithographic masks or computer data records as is known in the art. The customer logic is formed on the sides of the cores as shown in FIG. 4. At step 458 the customer logic is interconnected with selected cores, to achieve the customer's design. In a preferred embodiment, the substrate plane conductors use first and second layer metallization while the thick wires use third and fourth level metal. By providing selected port connections to the cores the design time is minimized because a designer need only design to the I/O characteristics of the cores through the ports. This effectively isolates the circuitry within the cores from topological and logical design considerations.

For many designs a critical path is between memory and customer logic. The invention eliminates much of these design problems by placing the customer logic at the edge and providing a non-planar interconnection scheme. Further, the use of zero-delay thick wires reduces or eliminates timing design errors since the propagation delay is near zero. Therefore, the iterative design process of the prior art is largely eliminated.

At step 460 the customer tests the prototype of the completed chip. Thus, the present invention provides a method of design that differs from the prior art in that the customer obtains a complete prototype in silicon at a very early stage. This eliminates the artificial timing errors that plague the prior art method of IC design. Further, the customer is provided with the entire system in silicon so that external emulation, simulation or interfacing to circuitry to duplicate missing portions of the system's functionality is no longer necessary.

An advantage of the present invention is in clock routing and other wide-distribution, high frequency signal routing. For example, a clock signal may be distributed to, each core using the, thick wires. This means that the distribution of the clock to each core will be substantially without phase errors. Clock distribution to the cores may be by third or fourth level thick wires with the clocks being distributed intra-core by first and second level conductors on the substrate. Also, where multi-chip modules (MCMs) are used the routing may be within the MCMs. Other signals may be distributed similarly.

At step 462 a determination is made as to whether there are design updates or design errors to correct. If so, the loop of steps 456–462 is repeated. If there are no further changes to the chip design the method of flowchart 450 is exited at step 464. If changes to the design need to be made the customer receives the benefit of the pre-fabricated cores and interconnection routings since the customer's updates will, most likely, result in changes to the customer logic at the periphery of the chip and not to the cores or bulk of the interconnections toward the center of the chip. The customer modifications will be more readily "programmable" by the use of metal masks, fuses (e.g., in FPGAs, programmable logic devices, etc.), programmable read-only memory devices, software patches to the chip, etc. These optional approaches are shown as step 466 in flowchart 450.

In the foregoing specification, the invention has been described with reference to a specific exemplary embodiment thereof. It will, however, be evident that various modifications and changes may be made thereunto without departing from the broader spirit and scope of the invention as set forth in the appended claims. Many such changes or modifications will be readily apparent to one of ordinary skill in the art. The specification and drawings are, accordingly, to be regarded in an illustrative rather than a restrictive sense, the invention being limited only by the provided claims.

What is claimed is:

1. An integrated circuit formed on a silicon substrate, wherein the silicon substrate has a planar surface, the integrated circuit comprising:

a first core formed on the planar surface of the silicon substrate, wherein the first core includes a first microcircuit with a first conductor contact;

a second core formed on the planar surface of the silicon substrate, wherein the second core includes a second microcircuit with a second conductor contact;

a first conductive path from the first conductor contact to a first point outside the planar surface;

a second conductive path from the second conductor contact to a second point outside the planar surface; and a third conductive path between the first and second points;

wherein the third conductive path electrically connects the first and second cores of the silicon substrate outside the planar surface of the silicon substrate.

2. The integrated circuit of claim 1, wherein the first and second conductive paths are formed by solder bumps on the silicon substrate.

3. The integrated circuit of claim 2, wherein the third conductive path is formed by a thick wire conductor coupled to the solder bumps.

4. A method for interconnecting multiple cores fabricated on a silicon substrate, wherein the silicon substrate has a planar surface, the method comprising the steps of:

forming a first core on the planar surface of the substrate, wherein the first core includes a first microcircuit with a first conductor contact;

forming a second core on the planar surface of the substrate, wherein the second core includes a second microcircuit with a second conductor contact;

creating a first conductive path from the first conductor contact to a first point outside the planar surface;

creating a second conductive path from the second conductor contact to a second point outside the planar surface; and providing an electrically conductive path outside the planar surface between the first and second points so that an electrical signal my be exchanged between the first and second conductor contacts.

5. The method of claim 4, further comprising the steps of:

wherein the step of creating a first conductive path includes the substep of depositing a first solder bump on the first conductor contact; and wherein the step of creating a second conductive path includes the substep of depositing a second solder bump on the second conductor contact.

6. The method of claim 5, wherein the step of providing an electrically conductive path includes the substep of coupling a thick wire conductor between the first and second solder bumps.

7. A method for fabricating an electrical circuit on a silicon substrate, the method comprising the steps of:

defining a plurality of core cell definitions, wherein each core cell definition includes a microcircuit definition suitable for fabrication on a silicon substrate, wherein each core cell definition further includes a definition of a conductor contact for transferring an electrical signal between the microcircuit defined by the core cell definition and external circuit, wherein each core cell definition specified its microcircuit and conductor contact in a two dimensional plane;

creating a functional design for the electrical microsystem, wherein the functional design includes two or more core cell definitions residing in a common plane;

creating a topological connection design for interconnecting conductor contacts among the two or more core cell definitions;

transferring the two or more core cell definitions included in the functional design to the silicon substrate so that a plurality of formed cores are formed in a common plane on the silicon substrate in accordance with the core cell definitions, wherein each formed core includes the microcircuit and conductor contact defined in the respective core cell definition; and using the topological connection design to interconnect the conductor contacts among the plurality of formed cores by fabricating electrical conductors according to the topological connection design in a second plane distinct from the common plane;

wherein the plurality of formed cores on the silicon substrate are electrically connected in the second plane distinct from the common plane.

8. The method of claim 7, further comprising the steps of:

depositing solder bumps on two or more conductor contacts; and interconnecting the conductor contacts by electrically coupling the solder bumps together.

9. The method of claim 7, further comprising the steps of:

forming peripheral logic along one or more sides of the silicon substrate; and wherein the step of "using the topological connection design" includes the substep of interconnecting the peripheral logic with one or more cores by fabricating electrical conductors according to the topological connection design in a second plane distinct from the common plane.

10. The method of claim 7, further including the step of:

incorporating a clock distribution scheme into the electrical circuit design by performing the steps of providing for internal distribution of a clock signal within a formed core by obtaining the clock signal from the conductor contact within the formed core; and providing for external distribution of the clock signal by transferring the clock signal between two or more cores according to the "using the topological connection design" step, above.

11. A method for designing electrical connections between cores of an integrated circuit, comprising the steps of:

laying out a plurality of cores for an integrated circuit on a planar surface of a substrate;

for each core, specifying a conductive path from the core to a point outside the planar surface; and specifying a conductive path outside the planar surface of the substrate between points on conductive paths to different cores of the integrated circuit on the substrate.

12. The method of claim 11, wherein the conductive path outside the planar surface is specified as being thicker than conductive paths of the integrated circuit on the planar surface.

13. The method of claim 11, wherein the cores are laid out in an area adjacent to one another.

14. The method of claim 13, wherein the area is in the center of the integrated surface on the substrate.

15. An integrated circuit designed according to the method of claim 11.

16. A method of packaging an integrated circuit, comprising the steps of:

providing a substrate having an integrated circuit thereon with a first area for cores and a second area for custom logic, the cores and custom logic being interconnected within a plane of the substrate with thin conductors, and the cores being formed adjacent to each other within the first area;

forming solder bumps on pads of the cores; and electrically connecting the solder bumps with thick conductors outside the plane of the substrate.

17. The method of claim 16, wherein the cores in the first area are adjacent preventing interconnection of the cores within the plane of the substrate.

18. The method of claim 16, wherein the first area is within the center of the integrated circuit and the second area surrounds the first area on a periphery of the integrated circuit on the substrate.

19. An integrated circuit packaged according to the method of claim 16.

* * * * *